(12) United States Patent
Chanda et al.

(10) Patent No.: US 7,397,260 B2
(45) Date of Patent: Jul. 8, 2008

(54) STRUCTURE AND METHOD FOR MONITORING STRESS-INDUCED DEGRADATION OF CONDUCTIVE INTERCONNECTS

(75) Inventors: Kaushik Chanda, Fishkill, NY (US); Birendra Agarwala, Hopewell Junction, NY (US); Lawrence A. Clevenger, La Grangeville, NY (US); Andrew P. Cowley, Wappingers Falls, NY (US); Ronald G. Filippi, Wappingers Falls, NY (US); Jason P. Gill, Essex Junction, VT (US); Tom C. Lee, Essex Junction, VT (US); Baozhen Li, South Burlington, VT (US); Paul S. McLaughlin, Poughkeepsie, NY (US); Du B. Nguyen, Danbury, CT (US); Hazara S. Rathore, Stormville, NY (US); Timothy D. Sullivan, Underhill, VT (US); Chih-Chao Yang, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 51 days.

(21) Appl. No.: 11/163,948

(22) Filed: Nov. 4, 2005

(65) Prior Publication Data
US 2007/0115018 A1 May 24, 2007

(51) Int. Cl.
*G01R 31/02* (2006.01)
*H01L 23/58* (2006.01)
*G01N 25/20* (2006.01)

(52) U.S. Cl. .................... 324/763; 257/48; 374/57

(58) Field of Classification Search ........... 324/158.1, 324/765, 763; 257/48; 374/57
See application file for complete search history.

(56) References Cited

U.S. PATENT DOCUMENTS 5,252,382 A    10/1993    Li ........................... 428/209

(Continued)

FOREIGN PATENT DOCUMENTS

EP          0834913 A1    4/1998

(Continued)

OTHER PUBLICATIONS

PCT International Search Report, PCT Application No. PCT/EP2006/067590, mailed Mar. 5, 2007.

*Primary Examiner*—Ernest F Karlsen
(74) *Attorney, Agent, or Firm*—Daryl K. Neff

(57) ABSTRACT

A microelectronic element such as a chip or microelectronic wiring substrate is provided which includes a plurality of conductive interconnects for improved resistance to thermal stress. At least some of the conductive interconnects include a metallic plate, a metallic connecting line and an upper metallic via. The metallic connecting line has an upper surface at least substantially level with an upper surface of the metallic plate, an inner end connected to the metallic plate at one of the peripheral edges, and an outer end horizontally displaced from the one peripheral edge. The metallic connecting line has a width much smaller than the width of the one peripheral edge of the metallic plate and has length greater than the width of the one peripheral edge. The upper metallic via has a bottom end in contact with the metallic connecting line at a location that is horizontally displaced from the one peripheral edge by at least about 3 microns (μm).

12 Claims, 4 Drawing Sheets

U.S. PATENT DOCUMENTS

| | | | |
|---|---|---|---|
| 5,439,731 A | 8/1995 | Li et al. | 428/209 |
| 5,712,510 A * | 1/1998 | Bui et al. | 257/758 |
| 6,037,795 A * | 3/2000 | Filippi et al. | 324/763 |
| 6,417,572 B1 * | 7/2002 | Chidambarrao et al. | 257/773 |
| 6,680,484 B1 * | 1/2004 | Young | 257/48 |
| 6,822,437 B1 | 11/2004 | Hau-Riege et al. | |
| 6,831,365 B1 | 12/2004 | Yao et al. | 257/758 |
| 6,867,056 B1 | 3/2005 | Hau-Riege et al. | |
| 2002/0017906 A1 * | 2/2002 | Ho et al. | 324/526 |
| 2004/0106219 A1 | 6/2004 | Yoshida et al. | |
| 2004/0173803 A1 | 9/2004 | Kim | 257/81 |
| 2004/0173905 A1 | 9/2004 | Kamoshima et al. | 257/758 |
| 2004/0201104 A1 | 10/2004 | Domae et al. | |
| 2004/0207383 A1 | 10/2004 | Wang | |
| 2004/0238959 A1 * | 12/2004 | Yao et al. | 257/758 |
| 2004/0238964 A1 | 12/2004 | Kawano et al. | 257/758 |
| 2004/0245639 A1 | 12/2004 | Yao et al. | 257/758 |
| 2004/0251555 A1 | 12/2004 | Asai et al. | 257/774 |

FOREIGN PATENT DOCUMENTS

| | | |
|---|---|---|
| WO | WO2004/048985 A1 | 6/2004 |

* cited by examiner

STRUCTURE AND METHOD FOR MONITORING STRESS-INDUCED DEGRADATION OF CONDUCTIVE INTERCONNECTS

BACKGROUND OF THE INVENTION

The present invention relates to microelectronic circuit substrates including active integrated circuits and passive integrated circuits, and microelectronic wiring substrates, and more particularly to conductive interconnects therein.

Integrated circuits ("ICs" or "chips") can be categorized according to function and the devices they contain, i.e., into active chips which contain active elements such as transistors, and/or other gain devices including diodes, and passive chips which contain only passive elements, e.g., capacitors, inductors and/or resistors. Microelectronic wiring substrates, especially multi-layer wiring substrates, are sometimes used to provide fine pitch or relatively fine pitch wiring for interconnecting a relatively high number of external terminals of one chip to other devices and/or another chip. Within such microelectronic wiring substrates and chips, electrical interconnection is provided using conductive interconnects.

Whether on active chips, passive chips or microelectronic wiring substrates, conductive interconnects are subject to fail due to stresses which occur at times when such chips or wiring substrates are installed in end products for their intended use. Stresses due to the accumulated effects of heating chips during their use lifetimes can contribute to a particular failure mechanism known as thermo-mechanical stress degradation or stress-induced voiding. When a chip is heated for a prolonged accumulated time, e.g., such as due to heat generated internally by the chip or by devices and/or other chips near the subject chip, the structure of conductive interconnects of the chip are subject to change. A void may form at a location which degrades the conductivity of the electrical interconnect structure. Alternatively, or in addition thereto, conductive material from one portion of one interconnect structure may travel or diffuse outside of intended boundaries, causing the degree of isolation between the one interconnect structure and another interconnect structure to become degraded, e.g., leading to a "short circuit" condition. Both of these types of failures can be attributed to thermo-mechanical stress degradation or stress-induced voiding.

Copper interconnects used in advanced semiconductor chips are vulnerable to thermo-mechanical stress degradation. Copper interconnects are typically formed by damascene processing (or dual damascene processing in which the vias and lines are formed in the same step) in which copper is deposited into openings in a prior-formed dielectric layer, after which excess copper is removed from the surface of the dielectric layer. The dielectric layer typically consists essentially of an oxide, such as silicon dioxide ($SiO_2$), carbon-doped oxide (SiCOH) or a polymer having desirable dielectric properties such as a low dielectric constant (low-k) dielectric. Due to the differing physical properties of the copper and the dielectric layer, there exists a mismatch between the coefficient of thermal expansion ("CTE") of the copper and the CTE of the dielectric layer. When the temperature of a chip is raised or lowered, CTE mismatch causes forces to be exerted on the interconnect metal relative to the dielectric material, in turn causing internal bending and/or cleaving within the interconnect and the surrounding dielectric material. Over time, the bending and cleaving leads to the above-described problems of degraded conductivity and increased incidence of short circuiting between conductive interconnects.

Another result of thermo-mechanical stress degradation is a tendency for voids to form at junctions between horizontally oriented conductive features such as metallic plates or lines, and conductive vias which provide vertical interconnection to the horizontal features. Metal features can be deposited by a process of plating (typically electroless plating followed by electroplating) sputtering, or alternatively, various processes of chemical vapor deposition ("CVD"). The deposition proceeds by the accumulation of individual grains of the metal on the underlying substrate. During such deposition, vacancies are trapped within the deposited metal. Vacancies are locations within a crystal lattice where individual atoms are missing. When a chip or wiring substrate containing metal features is maintained at a relatively high temperature for a sufficient amount of time, a thermo-mechanical stress is exerted upon the metal. Under such stress, vacancies move towards places where stress is concentrated and aggregate in those places to form voids. Locations where conductive vias connect to a metal plate or metal line are common points of failure where voids tend to form.

SUMMARY OF THE INVENTION

In accordance with one aspect of the invention, a method is provided for testing an ability of a microelectronic element having conductive interconnects to withstand thermal stress. Such method includes providing an interconnect test structure within the microelectronic element, the interconnect test structure including: i) a conductive metallic plate having an upper surface, a lower surface opposite the upper surface, and a plurality of peripheral edges extending between the upper surface and the lower surface, the upper surface defining a horizontally extending plane, the metallic plate having a width in a widthwise direction, a length in a lengthwise direction, and a thickness in a direction of a height of the upper surface from the lower surface, ii) a lower via consisting essentially of at least one of conductive or semiconductive material having a top end in conductive communication with the metallic plate and a bottom end vertically displaced from the top end, and iii) an upper metallic via in at least substantial vertical alignment with the lower conductive via. The upper metallic via has a bottom end in conductive communication with the metallic plate and a top end vertically displaced from the bottom end, and the upper metallic via has a width at least about ten times smaller than a larger one of the length of the metallic plate and the width of the metallic plate. The microelectronic element is maintained at an elevated temperature for a predetermined period of time. A first measurement of at least one electrical characteristic of the interconnect test structure is taken prior to an end of the predetermined period of time and a second measurement of the at least one electrical characteristic of the interconnect test structure is taken at an end of the predetermined period of time or thereafter. The difference between the first and second measurements is compared to at least one failure criterion to determine whether the microelectronic element passes or fails.

According to a particular aspect of the invention, the microelectronic element includes an integrated circuit containing active semiconductor devices, and includes a plurality of the interconnect test structures, wherein the step of making the first measurement includes measuring the at least one electrical characteristic of each of the plurality of interconnect test structures and the step of making the second measurement includes measuring the at least one electrical characteristic of each of the plurality of interconnect test structures. The step of comparing is performed relative to the first and second measurements of the at least one electrical characteristic of each of the interconnect test structures.

According to a particular aspect of the invention, the at least one electrical characteristic includes resistance, and the failure criterion includes an increase in the resistance by a predetermined amount.

According to a particular aspect of the invention, the at least one electrical characteristic includes leakage current, wherein the failure criterion includes an increase in the leakage current by a predetermined amount.

In a particular aspect of the invention, the bottom end of the upper metallic via contacts the metallic plate, and the interconnect test structure further includes an upper metallic line element in contact with the top end of the upper metallic via.

In a particular aspect of the invention, the interconnect test structure further includes a lower element consisting essentially of at least one of conductive or semiconductive material in contact with the bottom end of the lower via.

In a particular aspect of the invention, the interconnect test structure further includes a metallic connecting line, the metallic connecting line having an upper surface at least substantially level with the upper surface of the metallic plate, an inner end connected to the metallic plate, and an outer end horizontally displaced from at least one of the plurality of peripheral edges, the metallic connecting line having a width much smaller than the width of the at least one of the peripheral edges and a length greater than the width of the microelectronic element, wherein the bottom end of the upper metallic via contacts the metallic connecting line.

In accordance with one aspect of the invention, at least particular ones of the plurality of interconnect test structures fail in relation to the failure criterion, and the method further includes evaluating the characteristics of the particular failing ones to determine whether the microelectronic element passes or fails.

In a particular aspect of the invention, the microelectronic element includes a plurality of the integrated circuits attached to each other in a semiconductor substrate, the interconnect test structures being disposed in at least some of the plurality of integrated circuits, wherein at least one of the integrated circuits is disposed adjacent to an edge of the semiconductor substrate and at least one of the integrated circuits is disposed near a center of the semiconductor substrate.

In a particular aspect of the invention, the first measurement is taken prior to a beginning of the step of maintaining the microelectronic element at the elevated temperature.

In a particular aspect of the invention, the first measurement is taken during the step of maintaining the microelectronic element at the elevated temperature.

In a particular aspect of the invention, the step of maintaining the microelectronic element at the elevated temperature includes maintaining the microelectronic element at a temperature corresponding to a maximum stress due to thermal expansion mismatch and vacancy-related diffusion.

In a particular aspect of the invention, at least the metallic plate and the upper metallic via consist essentially of copper, wherein the microelectronic element is maintained at a temperature of 225 degrees centigrade.

In a particular aspect of the invention, at least the metallic plate and the upper metallic via consist essentially of copper, wherein the step of maintaining the microelectronic element includes maintaining the microelectronic element at temperatures of 175 degrees centigrade, 225 degrees centigrade and 275 degrees centigrade.

According to another aspect of the invention a microelectronic element includes a plurality of conductive interconnects, in which at least some of the conductive interconnects include a metallic plate, a metallic connecting line, and an upper metallic via. The metallic plate has an upper surface, a lower surface, and a plurality of peripheral edges extending between the upper surface and the lower surface. The upper surface defines a horizontally extending plane. The metallic plate has a width in a widthwise direction, a length in a lengthwise direction, and a thickness in a direction of a height of the upper surface from the lower surface. The metallic connecting line has an upper surface which is at least substantially level with the upper surface of the metallic plate, and has an inner end connected to the metallic plate at one of the peripheral edges, and an outer end horizontally displaced from the one peripheral edge. The metallic connecting line has a width much smaller than the width of the one peripheral edge and a length greater than the width of the one peripheral edge. The upper metallic via has a bottom end in contact with the metallic connecting line at a location horizontally displaced from the one peripheral edge by at least about 3 microns (μm).

In a particular aspect of the invention, a length of the metallic connecting line is greater than about ten times the width of the metallic connecting line.

In a particular aspect of the invention, the bottom end contacts the metallic connecting line at a location horizontally displaced from the one peripheral edge by at least 10 microns.

In a particular aspect of the invention, the metallic plate has a plurality of dielectric filled openings extending vertically between the upper surface and the lower surface.

In a particular aspect of the invention, the dielectric filled openings are arranged in a grid array pattern having at least two rows in the widthwise direction and at least two columns in the lengthwise direction.

In a particular aspect of the invention, the plurality of dielectric filled openings are arranged as a plurality of parallel elongated openings in the lengthwise direction such that the metallic plate has a plurality of parallel elongated branches extending in the lengthwise direction.

In accordance with another aspect of the invention, a structure is provided which is representative of a conductive interconnect in a microelectronic element for purposes of modeling stress-induced degradation. Such structure includes a metallic plate, a lower via in contact with the metallic plate, a lower element in contact with the bottom end of the lower via, an upper metallic via in at least substantial vertical alignment with the lower conductive via, and an upper metallic line element in contact with the top end of the upper metallic via.

In such structure, the metallic plate has an upper surface, a lower surface, and a plurality of peripheral edges extending between the upper surface and the lower surface. The upper surface defines a horizontally extending plane. The metallic plate has a width in a widthwise direction, a length in a lengthwise direction, and a thickness in a direction of a height of the upper surface from the lower surface. The lower via consists essentially of at least one of conductive or semiconductive material, and has a top end in conductive communication with the metallic plate and a bottom end vertically displaced from the top end. The lower element consists essentially of at least one of conductive or semiconductive material in contact with the bottom end of the lower via. The upper metallic via has a width at least about ten times smaller than a larger one of the length of the metallic plate and the width of the metallic plate and has a bottom end in conductive communication with the metallic plate and a top end vertically displaced from the bottom end. Preferably, the structure further includes an upper metallic line element in contact with the top end of the upper metallic via.

According to a preferred aspect of the invention, the bottom end of the upper metallic via contacts the metallic plate.

According to a preferred aspect of the invention, the structure further includes a metallic connecting line. The metallic connecting line has an upper surface at least substantially level with the upper surface of the metallic plate, an inner end connected to the metallic plate, and an outer end horizontally displaced from at least one of the plurality of peripheral edges. The metallic connecting line has a width much smaller than the width of the at least one of the peripheral edges and a length greater than the width of the microelectronic element, wherein the bottom end of the upper metallic via contacts the metallic connecting line.

According to a preferred aspect of the invention, the bottom end of the upper metallic via is horizontally displaced a distance greater than 0 microns (μm) from the peripheral edge.

According to a preferred aspect of the invention, the width of the metallic connecting line is equal to a critical dimension of the microelectronic element.

According to a preferred aspect of the invention, a length of the metallic connecting line is greater than about ten times the width of the metallic connecting line.

According to a preferred aspect of the invention, the bottom end of the upper metallic via contacts the metallic connecting line at a location closer to the outer end than the inner end.

According to a preferred aspect of the invention, the lower via includes a semiconductor material.

According to a preferred aspect of the invention, the metallic plate has a plurality of dielectric filled openings extending vertically between the upper surface and the lower surface.

According to a preferred aspect of the invention, the plurality of dielectric filled openings are arranged as a plurality of parallel elongated openings in the lengthwise direction such that the metallic plate has a plurality of parallel elongated branches extending in the lengthwise direction.

The embodiments of the invention are beneficial to interconnects formed of any metal susceptible to stress-induced voiding. Such metals include copper (Cu), aluminum (Al), gold (Au), silver (Ag) and alloys thereof. Vias and metal lines formed by dual damascene processing can contain liner materials for improved reliability. Such liner materials may include, but are not limited to, tantalum (Ta), tantalum nitride (TaN), titanium (Ti), titanium nitride (TiN) and tungsten (W).

BRIEF DESCRIPTION OF THE DRAWINGS

A top-down plan view of an interconnect test structure according to an embodiment of the invention is illustrated in FIG. 1.

DETAILED DESCRIPTION

Figure 1:
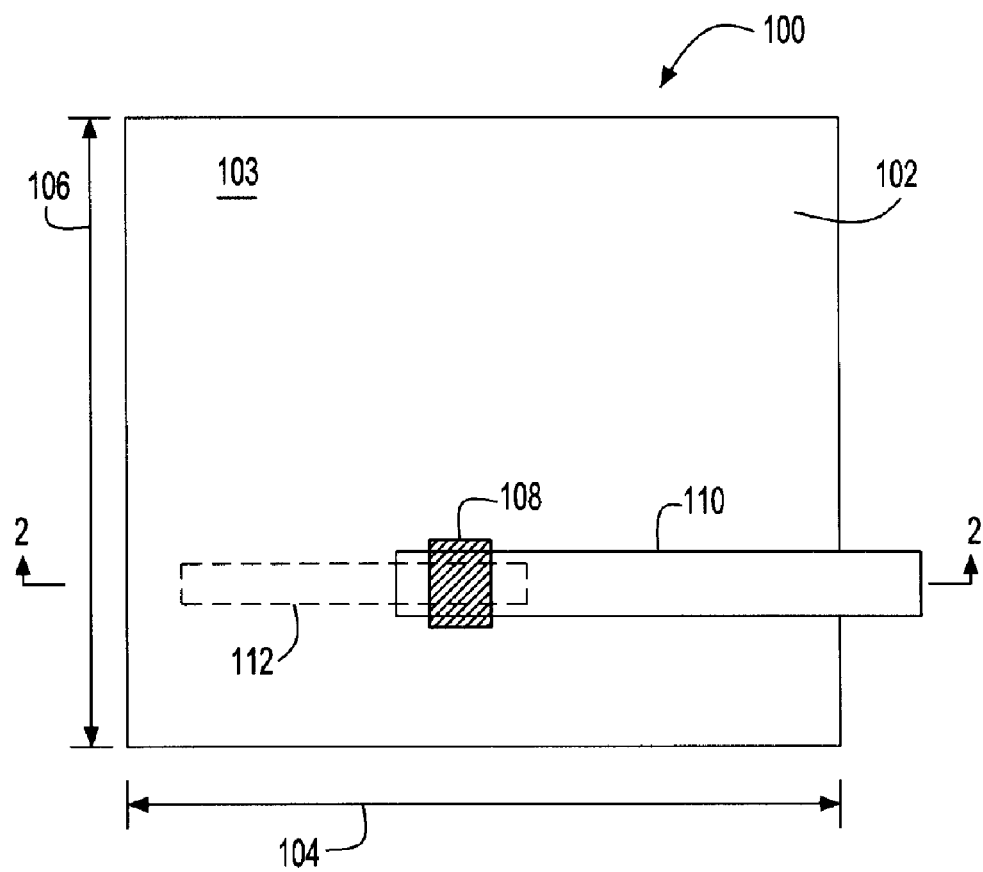

According to the certain embodiments of the invention, a method is provided for testing an ability of a microelectronic element to withstand thermal or thermo-mechanical stress. As is known, tolerance to such stress can vary according to the design of the microelectronic element and the conditions under which it is fabricated. Testing such as performed by heating the microelectronic element for a predetermined period of time can determine whether the design and the fabrication process are sufficiently robust. Today's standard of reliability requires that no more than a minute percentage of microelectronic elements fail during their expected lifetimes.

In such embodiment, an interconnect test structure is provided on a microelectronic element such as an active chip, passive chip or microelectronic wiring substrate, the interconnect test structure having features similar to those of an actual interconnect of the microelectronic element. Such interconnect test structure functions as one having a greater likelihood to fail than other interconnect structures of the microelectronic element. An exemplary interconnect structure has a metallic plate, a lower via which has a top end in conductive communication with the metallic plate, and an upper metallic via in at least substantial vertical alignment with the lower via. The lower and upper vias are the same as or similar to those of actual conductive interconnects of the chip used to conductively connect the metallic plate to a horizontally oriented lower conductive element and to a horizontally oriented upper conductive element, respectively.

To apply stress to the interconnect test structure, the microelectronic element is maintained at an elevated temperature for a predetermined period of time. Measurements are taken of at least one electrical characteristic to determine the effect of the stresses upon the interconnect test structure. Thus, a first measurement of the electrical characteristic is taken at a first time which may be before or after the start of applying the stress to the interconnect test structure and a second measurement of the same electrical characteristic is taken when the microelectronic element has been heated at least a substantial portion of the predetermined period of time after the taking of the first measurement.

Based on at least that measurement taken after the stress has been applied for a substantial period of time, it is determined whether the microelectronic element passes or fails. For example, in one embodiment, the value obtained in such measurement can be representative of whether the microelectronic element passes or fails, by comparing such value with a threshold value which marks the boundary between a failing interconnect test structure and a good interconnect test structure. For instance, the threshold between a good interconnect test structure and a failing one may be set at a resistance of 100 ohms such that when the resistance measurement is less than 100 ohms, the microelectronic element is found to pass, and when the resistance measurement is greater than 100 ohms, the microelectronic element is found to be failing.

Alternatively, in another embodiment, the two measurements are compared to obtain the difference between them, the difference indicating the amount of degradation caused by the stress over the substantial portion of the predetermined period of time. The difference is then compared to a failure criterion to determine whether the microelectronic element passes or fails. For example, a greater than twenty percent (20%) increase in the resistance between the two measurements can indicate that the microelectronic element fails.

A top-down plan view of an interconnect test structure utilized in such embodiment of the invention is illustrated in FIG. 1. As shown in FIG. 1, the test structure includes a metallic plate 102 which consists essentially of one or more deposited metals. As representative of a copper interconnect structure, the metallic plate is preferably a damascene metal pattern disposed within an opening of a dielectric layer. The dielectric layer preferably consists essentially of an oxide such as an oxide of silicon and the metal pattern includes a diffusion barrier material lining the inner walls of the opening in the dielectric layer, and a metal such as copper deposited, e.g., as by one or more processes such as plating and vapor deposition to fill the remaining space within the openings.

The metallic plate has an upper surface 103 and a lower surface opposite the upper surface, the upper surface defining a plane which extends horizontally within the microelectronic element. The upper surface 103 has a width 104 in a widthwise direction of the metallic plate and a length 106 in a lengthwise direction. The metallic plate 102 is preferably conductively contacted by additional conductive or semiconductive features which include an upper metallic via 108 having a bottom end conductively connected to the metallic plate, that via extending upwardly from the metallic plate. The upper metallic via consists essentially of copper, also having a structure including a diffusion barrier layer, similar to that of the metallic plate. In addition, preferably the metallic plate is also conductively contacted by a lower via (as shown and described with reference to FIG. 2 below), the lower via consisting essentially of at least one of: a metal, or a semiconductor.

Preferably, the interconnect test structure also includes an upper metallic line 110 which is conductively connected to the upper metallic via. In addition, the test structure also preferably includes a lower conductive line 112 consisting essentially of at least one of a metal or a semiconductor, the lower conductive line being conductively connected to the metallic plate by the lower via (not shown in FIG. 1). In a particular embodiment, the metallic plate 102 is a feature of an "M1", i.e., a first "metallization" (horizontal wiring pattern) level of a plurality of "back end of line" ("BEOL") metallization levels of the chip. The upper metallic line 110, when present, is a feature of an "M2" or "second metallization" level of the chip. The lower conductive line may consist essentially of a semiconductor material, a metal or a combination of semiconductor material and a metallic silicide, metal compound, and/or a metal. If the lower conductive line consists essentially of a semiconductor material and/or metallic silicide, it is generally a feature of "front end of line" ("FEOL") processing, i.e., processing associated with the fabrication of the semiconductor devices of the chip.

The inventors have found that such interconnect test structure is representative of actual interconnects of a microelectronic element such as an active semiconductor chip and is representative of a structural arrangement in which the effects of thermo-mechanical stress are particularly strong. This is partly due to the large volume of the metallic plate 102, which as deposited, contains a large amount of vacancies, such vacancies being subject to aggregating and causing voids. The close proximity of the upper and lower vias to the metallic via mean that these vias are close to a large amount of the vacancies within the metallic plate. Through application of thermo-mechanical stress, the vacancies tend to travel within the metallic plate and collect at the connection points of the metallic plate with the vias. One reason for this is the tensile stress that is present within the deposited copper plate. Tensile stress causes the copper material within the metallic plate to have a tendency to pull away from the walls of the openings in the dielectric layer, and to pull away from other structures which connect to the copper plate such as the vias. When the upper metallic via is formed of copper, tensile stress within the via and within the metallic plate both have a tendency to pull away from each other, which may be a reason why vacancies tend to aggregate at the connection point between the metallic plate and the via. Another factor making the interconnect test structure particularly subject to stress failure is the alignment of the upper metallic via and the lower via in the vertical direction, which tends to heighten the tendency of the vacancies to aggregate at the aligned connection points.

Thus, the interconnect test structure is one that is likely to fail in relation to a failure criterion at an earlier point in time compared to an actual interconnect of the microelectronic element. Alternatively, when a number of such interconnect test structures are provided on one microelectronic element, the incidence of a failure is expected to be greater among a given sample size than the incidence of failure among the actual interconnects of that microelectronic element. Monitoring and evaluating the performance of such interconnect test structure(s) during thermal stress testing provides information on the reliability of the design and fabrication process used to make the actual interconnects of the chip.

Figure 2:
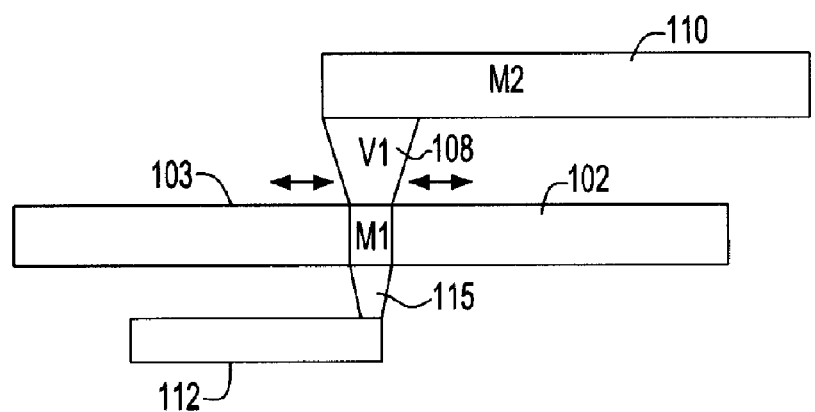
FIG. 2 is a corresponding sectional view of the interconnect test structure shown in FIG. 1.

FIG. 2 is a sectional view through lines 2-2 of the interconnect test structure shown in FIG. 1. As shown therein, the metallic plate 102, denoted "M1", extends in the horizontal direction, having an upper surface 103 conductively connected to an upper metallic via ("V1") 108. The via 108 conductively connects the metallic plate to an upper metallic line 110 (denoted "M2") in FIG. 2. The upper metallic line 110 and upper metallic via 108 are preferably formed by dual damascene processing in which a via opening is formed in the dielectric layer and a line opening is formed in alignment therewith, after which the diffusion barrier layer and copper metal fill are deposited therein.

As also shown in FIG. 2 the lower conductive via 115 described above conductively connects the metallic plate 102 to a lower conductive line 112, the lower conductive line preferably including one or more materials such as a deposited semiconductor, a metal, a silicide of a metal or a metal compound.

In a method of testing the ability of the microelectronic element to withstand thermal stress, whether the microelectronic element is a chip or wiring substrate, an interconnect test structure such as shown and described relative to FIGS. 1 and 2 is provided on the microelectronic element. For ease of description it will be assumed that the microelectronic element contains one or more active semiconductor chips. Thus, the microelectronic element can be a wafer or portion of a wafer containing a number of chips which await dicing into individual chips. Preferably, a number of such test structures are provided at different locations of each active chip and in a plurality of active chips disposed at different locations of such wafer or portion of wafer. For example, the interconnect test structure can be disposed in a chip located near a center of a wafer and in other chips located near a peripheral edge of the wafer. Alternatively, a multi-chip module is provided which contains a plurality of such interconnect test structures disposed at different locations therein which may be subject to differing degrees of thermo-mechanical stress.

The microelectronic element then undergoes thermo-mechanical stress by applying heat thereto to maintain the microelectronic element at least a predetermined elevated temperature for a predetermined period of time. When the microelectronic element is to operate at relatively low temperatures; i.e., temperatures below about 225 degrees centigrade, the heating step can be performed by maintaining the microelectronic element at such relatively low temperature, because the predominant failure mechanism differs depending on the temperature at which the thermal stress is applied to such microelectronic element. Thus, degradation due to mechanical stress, e.g., from CTE mismatch, predominates at relatively low temperatures, i.e., at temperatures under about 225 degrees centigrade. For example, to test for such degradation, the microelectronic element can be maintained at 175 degrees centigrade. On the other hand, when the microelectronic element is to operate at relatively high temperatures, i.e., temperatures above about 225 degrees centigrade, the heating step can be performed by maintaining the microelectronic element at such relatively high temperature. The predominant failure mechanism at relatively high temperatures is the diffusion of vacancies. To test for such kind of stress degradation, the microelectronic element can be maintained at 275 degrees centigrade, for example. When it is desired to test for a particularly bad scenario in which both effects are present to a large degree, the microelectronic element can be maintained at 225 degrees centigrade. In yet another alternative, the temperature of the microelectronic element is maintained at 175 degrees for a predetermined portion of the predetermined period of time, and maintained at 225 degrees during another predetermined portion of the predetermined period of time, and also stressing the microelectronic element at a temperature of 275 degrees for another portion of the predetermined period of time. For each temperature, a different set of samples is used to characterize the reliability performance.

Before or possibly sometime after the start of applying heat to the microelectronic element a measurement is taken of an electrical characteristic of the interconnect test structure. Resistance and leakage current are electrical characteristics which are each preferably monitored by comparing a first measurement of such characteristic with a subsequent measurement of such characteristic, taken after the microelectronic element has undergone a significant period of thermo-mechanical stress. Other electrical characteristics that can be monitored are capacitance and inductance. The measurements of resistance, leakage current, capacitance and inductance can be performed as direct current (DC) measurements and for a variety of different frequencies of interest in order to determine how well interconnects of the microelectronic element perform at DC and such higher operating frequencies.

As mentioned above, a single measurement of an electrical characteristic may be sufficient to indicate whether or not the interconnect test structure passes or fails after being stressed when the measurement is compared to a predetermined failure criterion. Alternatively, a measurement of one electrical characteristic at a particular time is compared to a later measurement of the same electrical characteristic and a difference is found between the two measurements. The difference indicates a degree of degradation due to the stress. In one example, an increase in the resistance by greater than twenty percent is considered to exceed the failure criterion. When the degree of degradation of a particular interconnect test structure is large, or the number of interconnect test structures showing such degradation is large, and then the microelectronic element can be classified as failing. In another example, an increase in leakage current of greater than 1 microampere (µA) is considered to exceed a failure criterion. In a particular preferred embodiment, the microelectronic element is heated for a predetermined period of time such as 200 hours, 500 hours, 1000 hours, 2000 hours, etc. for purpose of applying the thermo-mechanical stress to the microelectronic element.

In a particular embodiment, measurements of one or more electrical characteristics can be taken at a plurality of intervals prior to completing application of the thermo-mechanical stress for the predetermined period of time. Such measurements can be taken when the microelectronic element remains at the elevated stress temperature or at intervals between times when heat is applied to the microelectronic element.

In a variation of the above embodiment, the interconnect test structure, rather than the metallic plate being an M1 (first metallization) level pattern and have a lower conductive via extending to a level below the M1 level, the interconnect test structure includes a metallic plate at an M2 (second metallization) level pattern and has a lower metallic via extending downwardly from the M2 level pattern, and have an upper metallic via extending from the M2 level pattern to an M3 (third metallization level) pattern.

Figure 3:
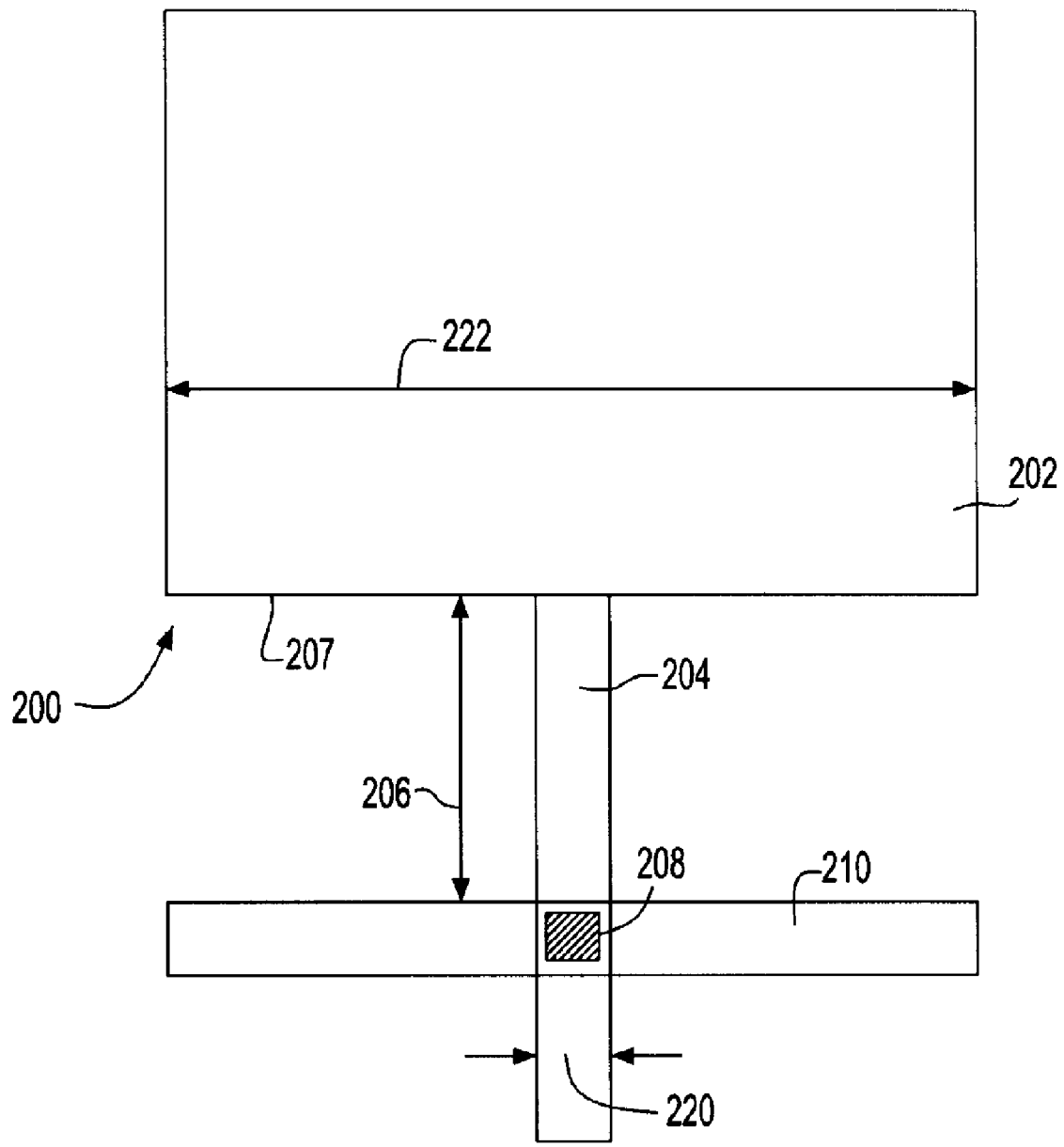
FIG. 3 is a top-down plan view of a conductive interconnect structure for use in a microelectronic element according to another embodiment of the invention.

FIG. 3 is a top-down plan view illustrating an alternative interconnect test structure 200 which can be utilized in the above-described method of testing a microelectronic element for withstanding thermo-mechanical stress. This interconnect test structure 200 differs from that shown and described relative to FIGS. 1-2 in that the connection 208 between the metallic plate 202 and the upper and lower conductive vias is horizontally displaced a substantial distance 206 from a peripheral edge 207 of a metallic plate, wherein the metallic plate has relatively large width. This structure is less subject to the formation of voids than that shown and described above relative to FIGS. 1-2 because the connection 208 is farther removed from a source of vacancies in the metallic plate. Here, interconnect test structures having one or more of several predetermined spacings 206 from the peripheral edge 207 can be provided on particular microelectronic elements. Heat is applied and electrical characteristics are measured in a manner such as that described above to provide a more complete picture of the reliability of the microelectronic element in withstanding the thermo-mechanical stresses applied to it.

In accordance with another embodiment of the invention, a microelectronic element has a plurality of actual conductive interconnects, in which special care has been taken to define the structural relationship between the parts of such interconnects. In such embodiment, an actual conductive interconnect has a structure such as shown in FIG. 3. The conductive interconnect includes a metallic plate 202, a metallic line 204 which is connected to and extends from a peripheral edge 207 of the metallic plate 202 of considerable width, and an upper metallic via having a connection point 208 to the metallic line in at least substantial vertical alignment with the lower via. The metallic line is one which has a width 220 which is much smaller than a width 222 of the metallic plate; e.g., the metallic line having a critical dimension width. In a particular embodiment, the width 222 of the metallic plate is at least ten times the width 220 of the metallic line 204 extending therefrom. The upper metallic via has a bottom end contacting an upper surface of the metallic line to provide conductive communication between the metallic line and a horizontally oriented upper conductive element. The upper metallic via connects to the metallic line at a location which is horizontally displaced from the one peripheral edge 207 by three or more microns (µm). The placement of the connection point of the via relatively far from the peripheral edge of the metallic plate helps to mitigate the effects of thermo-mechanical stresses upon the conductive interconnect structure. Placement of the connection point of the via to the metallic line at a distance of 10 microns or more from the peripheral edge is believed to have sufficient margin to prevent such thermo-mechanical stress failures from occurring anywhere within the microelectronic element during its expected lifetime.

Figure 4:
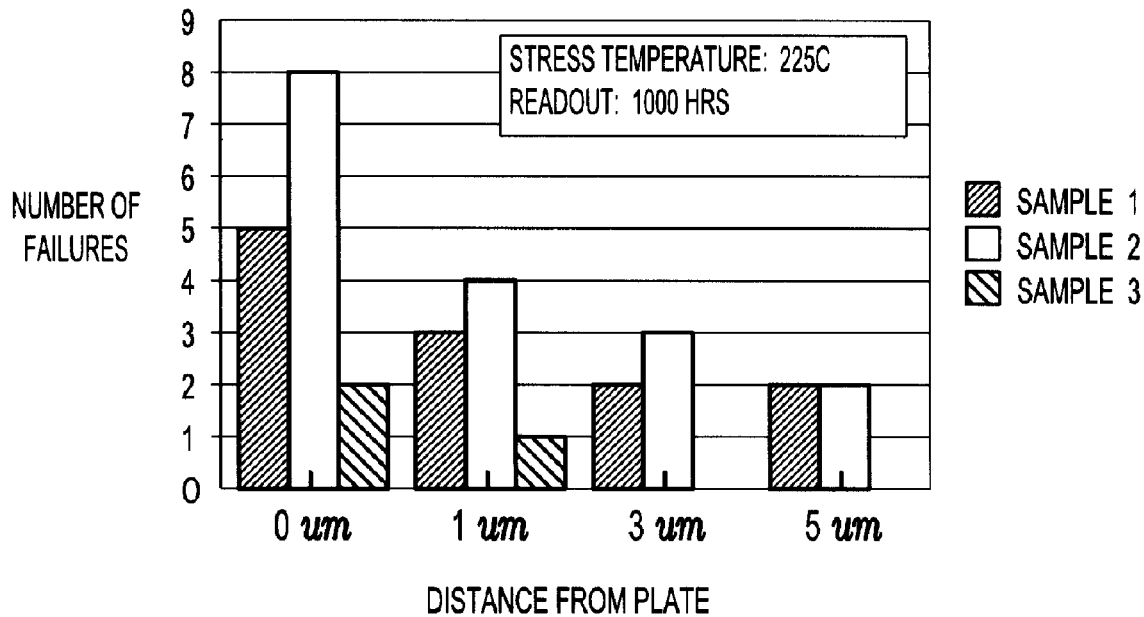
FIG. 4 is a graph illustrating results of thermo-mechanical stress testing of various conductive interconnect structures having a relatively large metallic plate at the M1 level, for different test samples.

FIG. 4 is a graph illustrating results of thermo-mechanical stress testing of conductive interconnect structures in accordance with the above-described embodiments. FIG. 4 illustrates test results for sample wafers (semiconductor device wafers) which have interconnect structures similar to the interconnect test structures 100 (FIG. 1) and 200 (FIG. 3) which have a relatively large metallic plate at the M1 level. During such test, thermo-mechanical stress is applied by maintaining the temperature of three semiconductor wafer samples (Sample 1, Sample 2, and Sample 3) at a maximum stress temperature of 225 degrees centigrade for 1000 hours. Measurements are taken of electrical characteristics of the interconnect test structures before each sample undergoes the long-term (1000 hour) stress and again after each sample has undergone the 1000 hours of stress. The measurements are then used to determine failure based on whether the resistance of each interconnect test structure increases more than 20% as a result of the 1000 hours of stress, and whether the amount of leakage current from any one interconnect test structure exceeds 1 microampere (µA). If either such criterion is exceeded, it is counted as a failure against that particular one test sample. If neither criterion is exceeded for any of the interconnect test structures of that sample, then no failure is recorded.

The data point at 0 um represents the results of the test on a conductive interconnect structure in which the via is connected at a location not more than 0 um (zero microns) away from the metal plate. Specifically, the via is either connected directly to the metallic plate or is connected to the metallic plate by way of a short metallic line extending from the metallic line, such line having length less than 500 nanometers (nm), considering the results of rounding. Test results are illustrated for three sample wafers. Each of the three sample wafers includes interconnect test structures as shown and described above relative to FIGS. 1-3. The dimensions of each metallic plate, each line and each via of the test structures, and the metals used and the processes applied are the same by design for all three sample wafers for each data point shown on the graph. However, as processing conditions in the fabrication of each sample wafer can vary, the results of testing are not.

As shown in FIG. 4 for the case of a 20% increase of resistance, the greatest number of failures for each individual sample wafer is seen where the via is most closely connected (at 0 um) to the metallic plate. Thus, the Sample 1 wafer exhibits 5 failures when the via is located within 0 um of the plate. At greater distances from the metallic plate, the number of failures per sample wafer decreases monotonically. Accordingly, for the number of failures recorded for the Sample 1 wafer decrease to 3 failures at a distance of 1 um, 2 failures at a distance of 3 um, and 2 failures at a distance of 5 um from the metallic plate. The results for Sample 2 wafer and the Sample 3 wafer follow the same pattern, in that each one exhibits fewer failures per sample wafer as the distance between the via and the metallic plate is increased. One of the samples, the Sample 3 wafer exhibited no more failures at the 3 um data point and beyond.

From the data shown in FIG. 4, the inventors conclude that when conductive interconnect structures are designed to have a greater distance between a relatively large metallic plate and the conductive via connected either directly or indirectly thereto, the likelihood of failure due to thermo-mechanical stress decreases. From an extrapolation of the data, it is expected that at a distance of 10 um (microns) from the peripheral edge of the metallic plate, the likelihood of failure drops to essentially zero.

Figure 5:
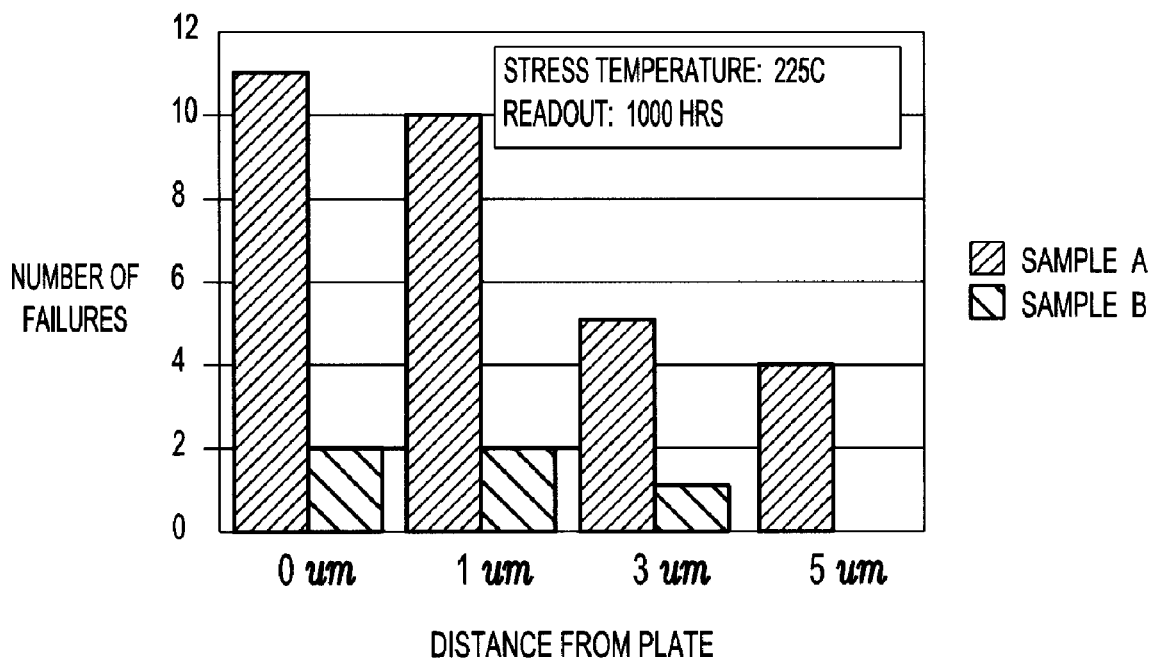
FIG. 5 is a graph illustrating results of thermo-mechanical stress testing of various conductive interconnect structures having a relatively large metallic plate at the M2 level, for different test samples.

FIG. 5 is a graph illustrating results of thermo-mechanical stress testing of various conductive interconnect structures in which the relatively large metallic plate is provided at the M2 level. Here, the interconnect test structure is similar in structure and dimensions to that described in FIGS. 1, 2 and 3 except that the relatively large metallic plate and the metallic line are provided at the M2 level, the upper metallic via extends above the level of the metallic plate, and the lower via and lower conductive line element are metallic features of the M1 level, instead of FEOL structures. Test conditions are the same as that described above with reference to FIG. 4, as well as the conditions under which measurements are taken and failures are determined. The data points are defined in the same manner as described above relative to FIG. 4, in that the data point "0 um" indicates an interconnect test structure in which the upper metallic via is either directly connected to the metallic plate or is connected to a short metallic line at a distance less than 500 nm from the peripheral edge of the metallic plate. Other data points indicate greater distances between the connection point of the upper metallic via and the peripheral edge of the metallic plate.

From the data shown in FIG. 5, the inventors again conclude that when conductive interconnect structures are designed to have a greater distance between a relatively large metallic plate and the conductive via connected either directly or indirectly thereto, the likelihood of failure due to thermo-mechanical stress decreases. From an extrapolation of the data, it is expected that at a distance of 10 um from the peripheral edge of the metallic plate, the likelihood of failure drops to essentially zero.

Figure 6:
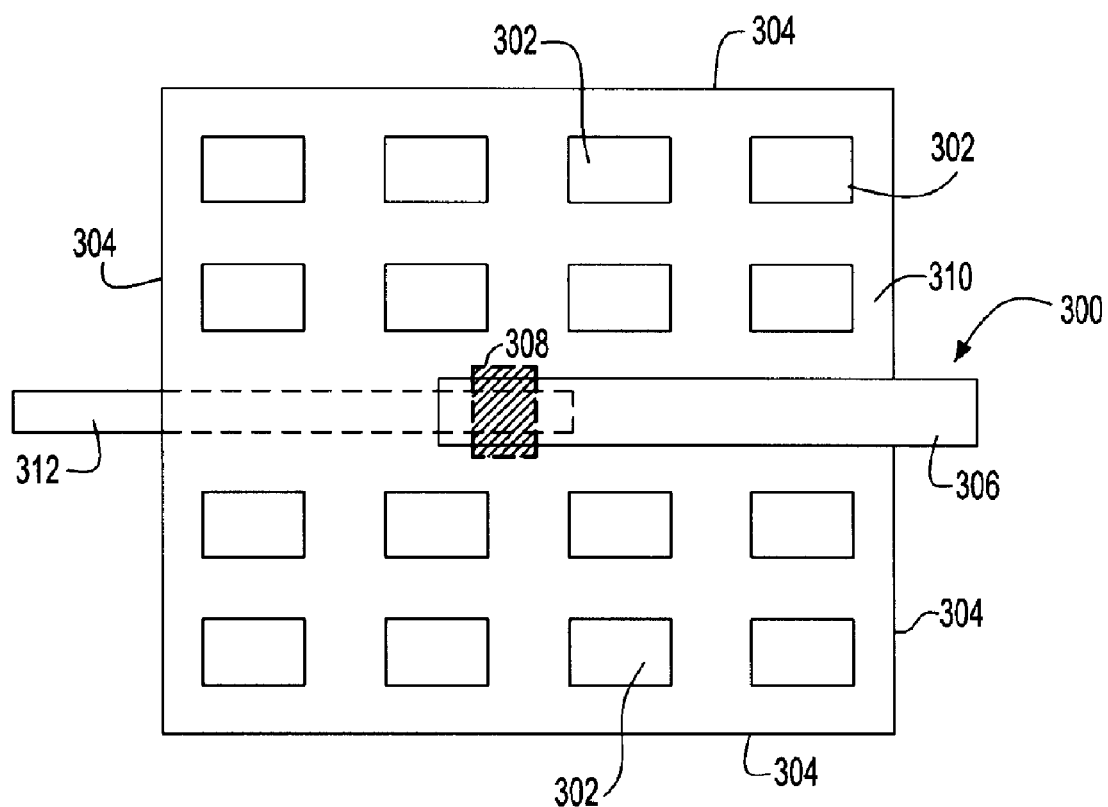
FIG. 6 is a top-down plan view of a conductive interconnect structure for use in a microelectronic element according to yet another embodiment of the invention.

FIG. 6 shows a particular embodiment of an interconnect structure 300 for use within a chip or other microelectronic element for better withstanding the effects of thermo-mechanical stress. Similar to the above-described interconnect structures, a metallic plate 300 is conductively connected to an upper metallic line 306 by an upper metallic via 308. A lower conductive via (not shown) conductively connects a lower surface of the metallic plate 310 to a lower conductive line 312 disposed below the metallic plate. Unlike the above-described embodiments, the metallic plate 300 has a plurality of dielectric filled openings 302 disposed in a grid pattern within the surface area defined by the peripheral edges 304 of the plate. The dielectric filled openings 302 act as elements which reduce the diffusion of vacancies in a horizontal direction across the metallic plate 310. These dielectric filled openings do not significantly impact the electrical and mechanical performance of the plate as a ground or shield, in conducting current or spreading heat, if applicable. Thus, fewer or less severe voids form at critical points of an interconnect structure as shown in FIG. 6, as compared to the voids which form according to the embodiment described above relative to FIGS. 1 and 2 or FIG. 3.

Figure 7:
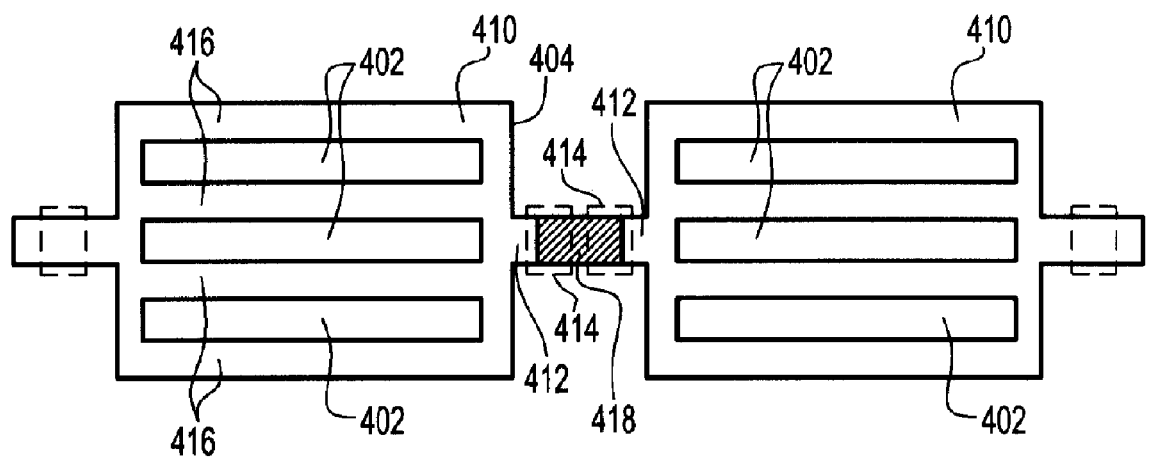
FIG. 7 is a top-down plan view of a conductive interconnect structure for use in a microelectronic element according to still another embodiment of the invention.

In yet another embodiment illustrated in FIG. 7, an interconnect structure is provided which mitigates effects of thermo-mechanical stress. Such structure includes a pair of metallic plates 410, e.g., M1 level metallic plates, which are joined together by way of metallic lines 412 (at the same M1 level) which extend from peripheral edges 404 of the metallic plates. The metallic lines 412 are conductively connected to each other by way of metallic vias 414 and a metallic line 418 at another metallization level, e.g., at the M2 metallization level. The metallic plates further include a set of parallel elongated openings 402 which are filled with dielectric material. These openings 402 are disposed as parallel elongated openings oriented in a lengthwise direction of the metallic plates 410. With the elongated dielectric openings 402 disposed therein, the metallic plates each have a plurality of parallel elongated branches 416 extending in the lengthwise direction 420 of the metallic plates.

As in the embodiment described above relative to FIG. 6, the interconnect structure according to this embodiment has conductive characteristics similar to the above-described embodiments in which the metallic plates do not incorporate dielectric filled openings. Problems due to the aggregation of vacancies at connection points between the metallic lines 412 or 418 and the vias 414 are mitigated by those connection points being spaced from the peripheral edges 404 of the metallic plates 410. The particular configuration of each metallic plate reduces the diffusion of vacancies towards those connection points.

While the invention has been described in accordance with certain preferred embodiments thereof, those skilled in the art will understand the many modifications and enhancements which can be made thereto without departing from the true scope and spirit of the invention, which is limited only by the claims appended below.

What is claimed is:

1. A method of testing an ability of a microelectronic element having conductive interconnects to withstand thermal stress, comprising:
    providing an interconnect test structure within said microelectronic element, said interconnect test structure including: i) a conductive metallic plate having an upper surface, a lower surface opposite said upper surface, and a plurality of peripheral edges extending between said upper surface and said lower surface, said upper surface defining a horizontally extending plane, said metallic plate having a width in a widthwise direction, a length in a lengthwise direction transverse to said width, and a thickness in a vertical direction extending between said upper surface and said lower surface, ii) a lower via consisting essentially of at least one of conductive or semiconductive material having a top end in conductive communication with said metallic plate and a bottom end vertically displaced from said top end, and iii) an upper metallic via in at least substantial vertical alignment with said lower conductive via such that a line extending in said vertical direction through said metallic plate intersects said upper metallic via and said lower conductive via, said upper metallic via having a bottom end in conductive communication with said metallic plate and a top end vertically displaced from said bottom end, said upper metallic via having a width at least about ten times smaller than a larger one of said length of said metallic plate and said width of said metallic plate;
    maintaining said microelectronic element at an elevated temperature for a predetermined period of time;
    taking a first measurement of at least one electrical characteristic of said interconnect test structure prior to an end of said predetermined period of time;
    taking a second measurement of said at least one electrical characteristic of said interconnect test structure at a time not prior to an end of said predetermined period of time; and
    comparing a difference between said first and second measurements to at least one failure criterion to determine whether said microelectronic element passes or fails.

2. The method as claimed in claim 1, wherein said microelectronic element includes an integrated circuit containing active semiconductor devices, said microelectronic element including a plurality of said interconnect test structures, wherein said step of making said first measurement includes measuring said at least one electrical characteristic of each of said plurality of interconnect test structures, said step of making said second measurement includes measuring said at least one electrical characteristic of each of said plurality of interconnect test structures and said step of comparing is performed relative to said first and second measurements of said at least one electrical characteristic of each of said interconnect test structures.

3. The method as claimed in claim 2, wherein said at least one electrical characteristic includes resistance, wherein said failure criterion includes an increase in said resistance by a predetermined amount.

4. The method as claimed in claim 2, wherein said at least one electrical characteristic includes leakage current, wherein said failure criterion includes an increase in said leakage current by a predetermined amount.

5. The method as claimed in claim 1, wherein said bottom end of said upper metallic via contacts said metallic plate, and said interconnect test structure further includes an upper metallic line element in contact with said top end of said upper metallic via, wherein said line intersects said upper metallic line.

6. The method as claimed in claim 1, wherein said interconnect test structure further includes a lower element consisting essentially of at least one of conductive material or semiconductive material in contact with said bottom end of said lower via, wherein said line intersects said lower element.

7. The method as claimed in claim 1, wherein said interconnect test structure further includes a metallic connecting line, said metallic connecting line having an upper surface at least substantially level with said upper surface of said metallic plate, an inner end connected to said metallic plate, and an outer end horizontally displaced from at least one of said plurality of peripheral edges, said metallic connecting line having a width much smaller than said width of said at least one of said peripheral edges and a length greater than a width of said microelectronic element, wherein said bottom end of said upper metallic via contacts said metallic connecting line.

8. The method as claimed in claim 2, wherein at least particular ones of said plurality of interconnect test structures fail in relation to said failure criterion, said method further comprising evaluating said characteristics of said particular failing ones to determine whether said microelectronic element passes or fails.

9. The method as claimed in claim 2, wherein said microelectronic element includes a plurality of said integrated circuits attached to each other in a semiconductor substrate, said interconnect test structures being disposed in at least some of said plurality of integrated circuits, wherein said at least some integrated circuits include at least a first integrated circuit of said plurality of integrated circuits disposed adjacent to an edge of said semiconductor substrate and at least a second integrated circuit disposed near a center of said semiconductor substrate.

10. The method as claimed in claim 1, wherein said step of maintaining said microelectronic element at said elevated temperature includes maintaining said microelectronic element at a temperature corresponding to a maximum stress due to thermal expansion mismatch and vacancy-related diffusion.

11. The method as claimed in claim 10, wherein at least said metallic plate and said upper metallic via consist essentially of at least one metal selected from the group consisting of copper (Cu), aluminum (Al), gold (Au), and silver (Ag), wherein said microelectronic element is maintained at a temperature of 225 degrees centigrade.

12. The method as claimed in claim 10, wherein at least said metallic plate and said upper metallic via consist essentially of at least one metal selected from the group consisting of copper (Cu), aluminum (Al), gold (Au), and silver (Ag), wherein said step of maintaining said microelectronic element includes maintaining said microelectronic element at temperatures of 175 degrees centigrade, 225 degrees centigrade and 275 degrees centigrade.

* * * * *